United States Patent
Miyajima

(10) Patent No.: US 10,408,692 B2
(45) Date of Patent: Sep. 10, 2019

(54) MECHANICAL QUANTITY MEASUREMENT DEVICE AND PRESSURE SENSOR USING SAME

(71) Applicant: Hitachi Automotive Systems, Ltd., Hitachinaka-shi, Ibaraki (JP)

(72) Inventor: Kentarou Miyajima, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 24 days.

(21) Appl. No.: 15/577,394

(22) PCT Filed: Jul. 29, 2016

(86) PCT No.: PCT/JP2016/072251
§ 371 (c)(1),
(2) Date: Nov. 28, 2017

(87) PCT Pub. No.: WO2017/056671
PCT Pub. Date: Apr. 6, 2017

(65) Prior Publication Data
US 2018/0164168 A1    Jun. 14, 2018

(30) Foreign Application Priority Data

Sep. 30, 2015   (JP) .................................. 2015-192508

(51) Int. Cl.
*G01L 1/18*   (2006.01)
*G01B 7/16*   (2006.01)
(Continued)

(52) U.S. Cl.
CPC .................. *G01L 1/18* (2013.01); *G01B 7/18* (2013.01); *G01L 1/2268* (2013.01);
(Continued)

(58) Field of Classification Search
CPC ... G01L 1/18; G01L 1/22; G01L 1/225; G01L 1/2287; G01L 1/2293
(Continued)

(56) References Cited

U.S. PATENT DOCUMENTS 4,712,082 A * 12/1987 Ito .......................... G01L 9/0055
338/4
2003/0177839 A1* 9/2003 Tsukada .................... G01L 1/18
73/774
(Continued)

FOREIGN PATENT DOCUMENTS

JP     2007-263781 A    10/2007
JP     2012-47608 A     3/2012
(Continued)

OTHER PUBLICATIONS

International Search Report (PCT/ISA/210) issued in PCT Application No. PCT/JP2016/072251 dated Sep. 27, 2016 with English translation (3 pages).
(Continued)

*Primary Examiner* — Benjamin R Schmitt
(74) *Attorney, Agent, or Firm* — Crowell & Moring LLP

(57) ABSTRACT

Provided are a mechanical quantity measurement device having a higher signal-to-noise ratio and resolution than the prior art and a pressure sensor using the same. A mechanical quantity measurement device that is provided with a plurality of Wheatstone bridges on the main surface of a single semiconductor substrate that are composed from impurity-diffused resistors and detect the difference between the strain amount occurring in the x-axis direction and the strain amount occurring in the y-axis direction, which intersect at right angles on the main surface of the semiconductor substrate, said mechanical quantity measurement device being characterized in that the impurity-diffused resistors
(Continued)

composing the plurality of Wheatstone bridges are disposed evenly in an area to be measured.

8 Claims, 13 Drawing Sheets

(51) Int. Cl.
 *G01L 1/22* (2006.01)
 *G01L 9/00* (2006.01)
 *G01L 9/06* (2006.01)
 *H01L 29/84* (2006.01)
(52) U.S. Cl.
 CPC .......... *G01L 1/2293* (2013.01); *G01L 9/0042* (2013.01); *G01L 9/0055* (2013.01); *G01L 9/06* (2013.01); *H01L 29/84* (2013.01)
(58) Field of Classification Search
 USPC ................................................... 73/774, 777
 See application file for complete search history.

(56) References Cited

U.S. PATENT DOCUMENTS

| 2006/0207339 | A1* | 9/2006 | Sumigawa | ............... G01B 7/18 73/777 |
| 2011/0259112 | A1 | 10/2011 | Shimazu et al. | |
| 2012/0048028 | A1* | 3/2012 | Miyajima | ............. G01L 1/2281 73/777 |
| 2013/0255393 | A1 | 10/2013 | Fukuzawa et al. | |

FOREIGN PATENT DOCUMENTS

| JP | 2013-205403 A | 10/2013 |
| WO | WO 2015/033669 A1 | 3/2015 |

OTHER PUBLICATIONS

Japanese-language Written Opinion (PCT/ISA/237) issued in PCT Application No. PCT/JP2016/072251 dated Sep. 27, 2016 (3 pages).

* cited by examiner

MECHANICAL QUANTITY MEASUREMENT DEVICE AND PRESSURE SENSOR USING SAME

TECHNICAL FIELD

The present invention relates to a technique for measuring a mechanical quantity, such as stress and strain, applied to a measured object, and more specifically relates to a mechanical quantity measuring apparatus including a strain detection region constituted by impurity diffusion resistors formed on a surface of a semiconductor substrate, and a pressure sensor using the same.

BACKGROUND ART

As an apparatus for measuring deformation (strain) of a measured object, a metal foil strain gauge in which a metal resistor (metal foil) is arranged on a thin insulating body has conventionally been well-known. The metal foil strain gauge is adapted to measure changes of an electric resistance value along with deformation of the metal foil in conformity with deformation of the measured object and convert the changes into a strain quantity and has widely been used due to a simple structure, a low price, and high accuracy. The metal foil strain gauge, however, is disadvantageous in that the configuration of the metal foil strain gauge easily causes a measurement error when the temperature of the measured object changes, in that the metal foil strain gauge consumes too high power to be driven at all times, and in that the metal foil strain gauge requires a certain installation area size.

As an apparatus for overcoming these disadvantages of the metal foil strain gauge, a semiconductor strain sensor is developed including a strain detection region (bridge circuit) constituted by impurity diffusion resistors formed on a surface of a semiconductor substrate. The semiconductor strain sensor can even detect ultra-fine strain (that is, has an advantage of being sensitive to strain) since the resistance change rate of the impurity diffusion resistor of the semiconductor strain sensor to strain is tens of times as high as that of the metal resistor of the conventional metal foil strain gauge. Also, with use of a so-called semiconductor process such as photolithography for formation of the impurity diffusion resistor, ultra-fine patterning of the impurity diffusion resistor is available. Thus, size reduction (area reduction) of the entire semiconductor strain sensor and electric power saving can be achieved. Further, ultra-fine patterning of the impurity diffusion resistors enables all of the resistors constituting a Wheatstone bridge circuit to be formed on the same substrate. Thus, fluctuation of electric resistance along with temperature changes of the measured object is canceled out, and this brings about an advantage of a decrease in measurement error (improvement of measurement accuracy).

For example, JP 2007-263781 A (PTL 1) describes a mechanical quantity measuring apparatus including a strain detection unit on a surface of a semiconductor substrate and attached to a measured object to measure strain. In this mechanical quantity measuring apparatus, a semiconductor single-crystal substrate is provided with at least two bridge circuits. One of the two bridge circuits is constituted by n-type diffusion resistors in which a direction (longitudinal direction) of measuring fluctuation of a resistance value while supplying current is parallel to the <100> direction of the semiconductor single-crystal substrate. The other bridge circuit is constituted by p-type diffusion resistors in combination in which a longitudinal direction is parallel to the <110> direction. According to PTL 1, a strain component generated in a measured object in a specific direction can be measured accurately (refer to the abstract).

Also, JP 2012-47608 A (PTL 2) discloses a mechanical quantity measuring apparatus using a bridge circuit formed on a semiconductor substrate. The bridge circuit consists of four bridge resistors $R_{v1}$, $R_{v2}$, $R_{h1}$, and $R_{h2}$. Each of the bridge resistors consists of a plurality of diffusion resistors. The plurality of diffusion resistors are arranged on the semiconductor substrate in a matrix form. The bridge resistors $R_{v1}$ and $R_{v2}$ are the plurality of diffusion resistors arranged in the odd rows of the matrix and selectively connected in series while the bridge resistors $R_{h1}$ and $R_{h2}$ are the plurality of diffusion resistors arranged in the even rows of the matrix and selectively connected in series. According to PTL 2, it is possible to prevent offset output of the bridge circuit caused by stress generated by temperature changes of a measured object, thermal distribution on the semiconductor substrate, and impurity dosage gradient of the diffusion resistors.

Meanwhile, a fundamental point in mechanical quantity measurement by means of a strain sensor is deformation of the strain sensor in conformity with deformation of a measured object. To detect finer deformation and achieve accurate mechanical quantity measurement, ultra-fine resistance changes of resistors used in the sensor are required to be detected. In this respect, in JP 2013-205403 A (PTL 3), for example, sensors for measuring mechanical quantities are mounted on a plurality of locations of a measured object, and an operational circuit connected to the output of the sensors performs operations, to enable accurate detection.

CITATION LIST

Patent Literature

PTL 1: JP 2007-263781 A
PTL 2: JP 2012-47608 A
PTL 3: JP 2013-205403 A

SUMMARY OF INVENTION

Technical Problem

For the purpose of energy saving and emission gas purification in an automotive engine, various techniques for more efficient fuel combustion are being examined and employed. However, in recent years, there is raised an increasing demand for the energy saving and the emission gas purification. A representative combustion technique for the energy saving is a technique for achieving combustion at a leaner ratio than the theoretical air fuel ratio. Also, a representative combustion technique for the emission gas purification is a technique for achieving stable and reliable combustion in a cylinder.

To achieve these combustion techniques effectively, precise control of fuel injection is essential. In achieving the precise control of fuel injection, a pressure sensor related to injection pressure control is one of key parts.

For example, in a common rail system for a diesel engine, a further increase of fuel pressure (for example, 2500 to 3000 bar) is proceeding to advance the energy saving and the emission gas purification. Also, component parts are strongly required to have higher pressure resistance and durability (long-time reliability). Among the component parts, the pressure sensor is an essential part for precise control and is strongly required to have higher accuracy as well as high pressure resistance and durability.

The strain sensors described in PTLs 1 to 3 have the aforementioned excellent effects. However, it has been found that further improvement is required in a semiconductor strain sensor (mechanical quantity measuring apparatus) to achieve updated requirement levels (particularly, high accuracy and long-time reliability) to the pressure sensor.

An object of the present invention is to provide a semiconductor strain sensor (mechanical quantity measuring apparatus) having higher accuracy than conventional one. Another object of the present invention is to provide a pressure sensor having higher accuracy than conventional one by using the mechanical quantity measuring apparatus.

Solution to Problem

To achieve the above object, a mechanical quantity measuring apparatus according to the present invention is a mechanical quantity measuring apparatus including a strain detection region constituted by impurity diffusion resistors formed on a main surface of a semiconductor substrate. The strain detection region includes a plurality of Wheatstone bridges. The mechanical quantity measuring apparatus according to the present invention is advantageous in that the resistors constituting the plurality of Wheatstone bridges are equally distributed and arranged in the detection region to cause the plurality of Wheatstone bridges to have approximately equal strain detection abilities. The mechanical quantity measuring apparatus according to the present invention is also advantageous in the following respect. By adding output signals of the plurality of Wheatstone bridges by means of an operational circuit arranged on the semiconductor substrate, respective sensor signals having approximately equal signal characteristics are added. On the other hand, random noise components generated in the resistors constituting a sensor are square-averaged. A signal-to-noise ratio of the sensor can be heightened, and accurate detection can be achieved.

Also, a pressure sensor according to the present invention is a pressure sensor having a semiconductor strain sensor connected onto a metallic diaphragm, and the semiconductor strain sensor is constituted by the aforementioned mechanical quantity measuring apparatus.

Advantageous Effects of Invention

According to the present invention, a mechanical quantity measuring apparatus having higher detection performance than conventional one can be provided. Also, by using the mechanical quantity measuring apparatus, a pressure sensor having higher accuracy and long-time reliability than conventional ones can be provided.

DESCRIPTION OF EMBODIMENTS

Hereinbelow, examples of embodiments of the present invention for heightening reliability of an implementation interface between a diaphragm and a silicon chip in a pressure sensor will be described.

Among various industrial part fields, an automotive part field is required to satisfy particularly strict conditions in terms of an applicable temperature range, weathering performance, accuracy, long-time reliability, and the like. As a result of study directed toward satisfying the various updated requirements in a pressure sensor using a semiconductor strain sensor, the present inventors has discovered that, in a Wheatstone bridge including four P-type diffusion resistors arranged in a semiconductor strain sensor, a ratio of a signal component output by strain to a noise component resulting from thermal noise generated by flow of current into the diffusion resistors is required to be higher than a conventional ratio.

Figure 1:
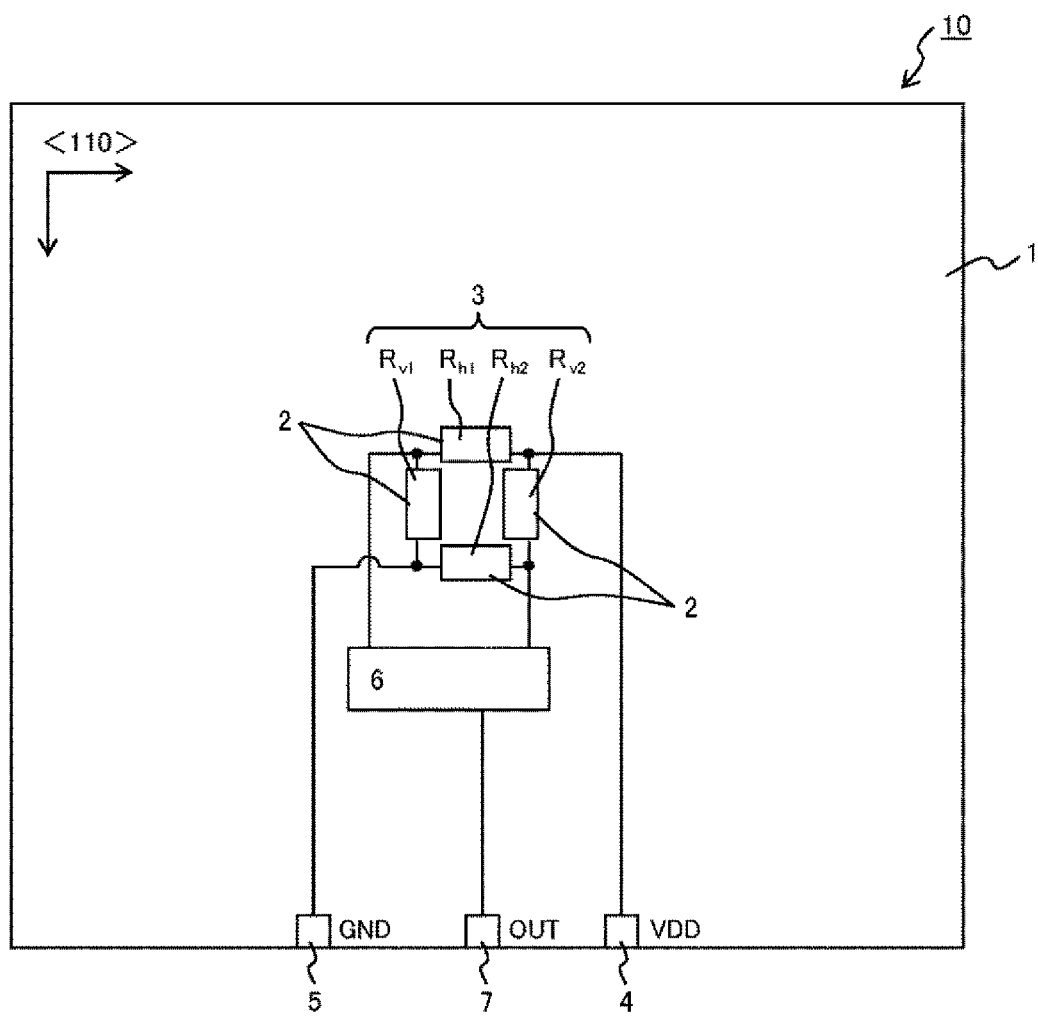
FIG. 1 is a schematic plan view illustrating an overview of a conventional semiconductor strain sensor used in an experiment.

FIG. 1 is a schematic plan view illustrating an overview of a Wheatstone bridge using four P-type diffusion resistors mounted in a conventional semiconductor strain sensor. Referring to FIG. 1, a configuration and a function of a conventional semiconductor strain sensor 10 will briefly be described. In the semiconductor strain sensor 10, a plurality of P-type diffusion resistors 2 are formed on a surface of a silicon single-crystal substrate 1, and the plurality of P-type diffusion resistors 2 are connected to each other as four bridge resistors $R_{v1}$, $R_{v2}$, $R_{h1}$, and $R_{h2}$ to constitute a Wheatstone bridge 3. The Wheatstone bridge 3 is connected to a power supply terminal 4 and a ground terminal 5 and is configured so that directions of current flowing in the four bridge resistors $R_{v1}$, $R_{v2}$, $R_{h1}$, and $R_{h2}$ may be a <110> direction of the silicon single-crystal substrate 1 and a direction perpendicular to the <110> direction. It is to be noted that the silicon is cubic crystal.

When strain is applied to the semiconductor strain sensor in the <110> direction of the silicon single-crystal substrate 1 or the direction perpendicular to the <110> direction, resistance values of the impurity diffusion resistors 2 (that is, the four bridge resistors $R_{v1}$, $R_{v2}$, $R_{h1}$, and $R_{h2}$) change, and a potential difference is generated in an output of the bridge voltage. This potential difference is amplified in an amplifier circuit 6 formed in the silicon single-crystal substrate 1 and is taken out as an electric signal from an output terminal 7. In this manner, the semiconductor strain sensor 10 can output an electric signal in accordance with the strain quantity applied to a region provided with the Wheatstone bridge 3 (strain detection region). At this time, output voltage VOUT of the semiconductor strain sensor 10 can be expressed by Equation (1) shown below.

$$VOUT = GAIN \cdot VDD((a-b)\varepsilon x - (a-b)\varepsilon y)/2 \quad (1)$$

In Equation (1), GAIN is gain of the amplifier circuit, a is a gauge factor in the direction parallel to current, b is a gauge factor in the direction perpendicular to current, VDD is power supply voltage, EX is X-direction strain, and εy is Y-direction strain.

At this time, in a case in which P-type diffusion resistors are used as resistors constituting the bridge, the gauge factor in the direction parallel to current and the gauge factor in the direction perpendicular to current are equal, and a and b in Equation (1) shown above can be expressed by Equation (2).

$$a \approx -b \quad (2)$$

Accordingly, Equation (1) is replaced with Equation (3).

$$\text{Signal component } S = VOUT = GAIN \cdot VDD \cdot a \cdot (sx - sy) \quad (3)$$

In other words, it is apparent that output voltage of the conventional semiconductor strain sensor using the P-type diffusion resistors is proportional to a difference between the X-direction strain and the Y-direction strain generated in the semiconductor strain sensor. Thus, it is known that, in a case in which a measured object isotropically changes in the X direction and in the Y direction due to expansion or compression caused by heat, the semiconductor strain sensor using the P-type diffusion resistors cancels the influence and exhibits favorable temperature dependency.

Also, since the P-type diffusion resistors used in the semiconductor strain sensor are higher than a strain gauge using a metal thin film in terms of the gauge factor and the sheet resistance value, high resistance is easily achieved. Thus, a value of current flowing in the bridge can be low, and a low-power-consumption sensor can be configured. However, at this time, current flows in the P-type diffusion resistors to cause thermal noise to be generated. In general, thermal noise of resistance is expressed as voltage in a manner shown in Equation (4).

$$\text{Noise component } N = (4 K_B T R \Delta f)^{1/2} \quad (4)$$

In Equation (4), KB is Boltzmann constant, T is a temperature, Δf is a bandwidth, and R is a resistance value.

That is, the noise increases in proportion to the one-half power of the resistance value of the P-type diffusion resistor used in the sensor bridge. Equation (3) shown above is a signal component of the semiconductor strain sensor while Equation (4) shown above is a noise component. By heightening the signal-to-noise ratio, high resolution of the semiconductor strain sensor can be achieved.

Figure 2:
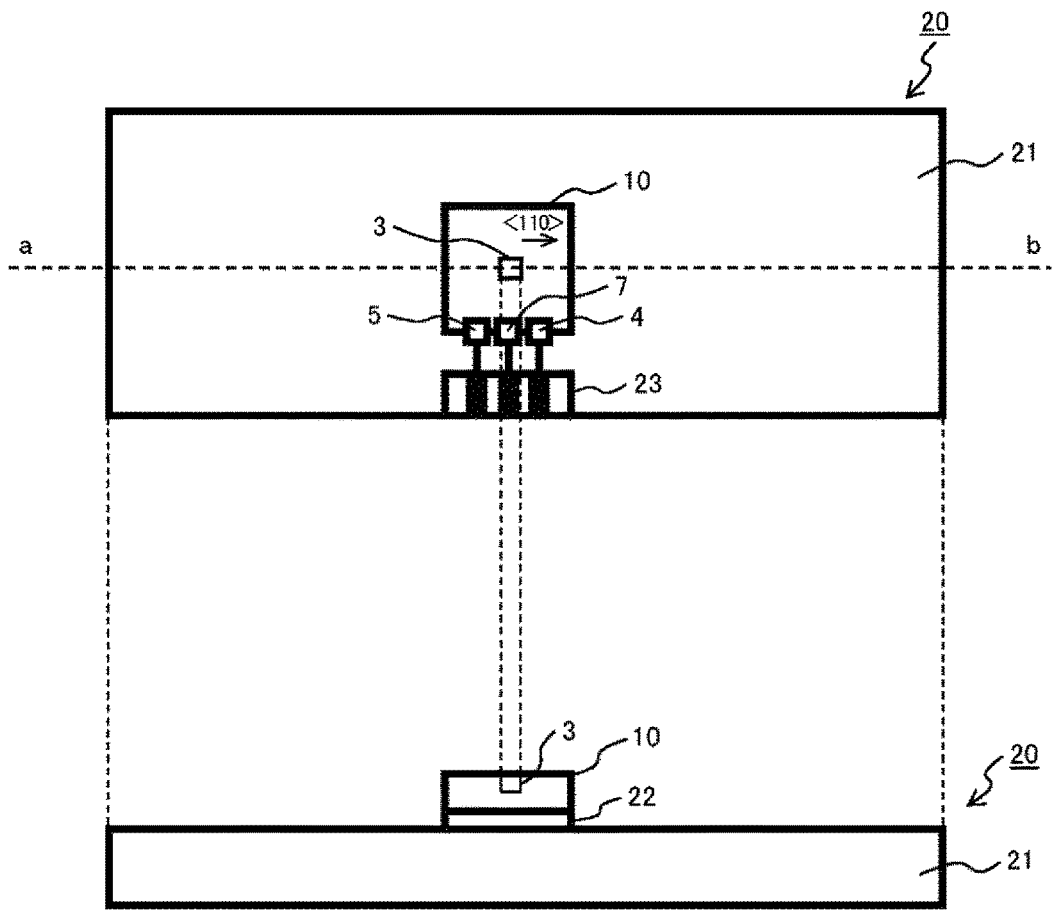
FIG. 2 is a schematic plan view illustrating an overview of a simulated pressure sensor used in the experiment and a schematic cross-sectional view along the line a-b.

FIG. 2 is a schematic plan view illustrating an overview of a simulated pressure sensor used in an experiment and a schematic cross-sectional view along the line a-b in the schematic plan view. As illustrated in FIG. 2, in a simulated pressure sensor 20, the semiconductor strain sensor 10 is connected via a solder joint layer 22 at an approximately center position of a metal plate 21, which is an imitation diaphragm. Since a pressure sensor for an automotive engine is provided in a high-temperature (for example, approximately 120 to 130° C.) environment, connection between the diaphragm and the semiconductor strain sensor is normally performed by solder joint. The metal plate 21 is provided with a terminal block 23, to which the power supply terminal 4, the ground terminal 5, and the output terminal 7 of the semiconductor strain sensor 10 are connected.

Figure 3A:
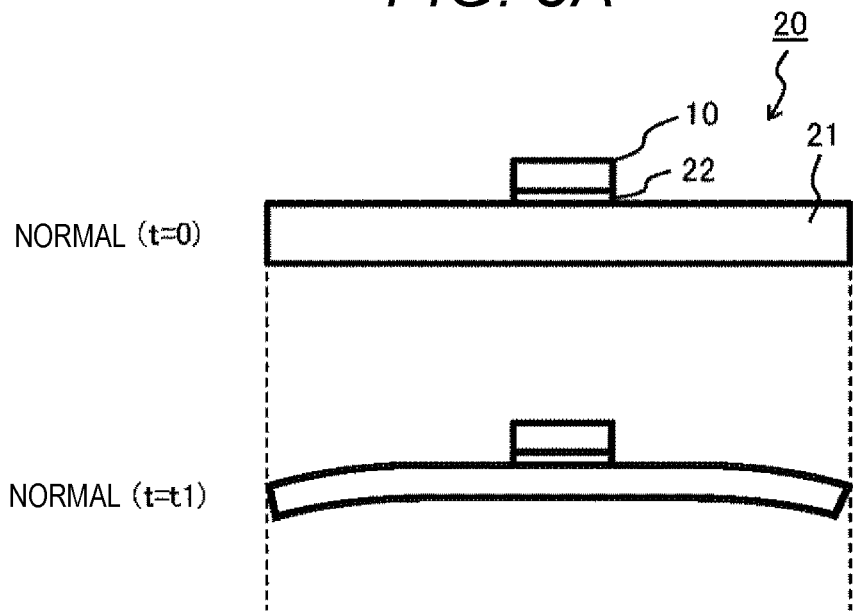
FIG. 3A is a schematic cross-sectional view illustrating a state of deformation of the simulated pressure sensor.
Figure 3B:
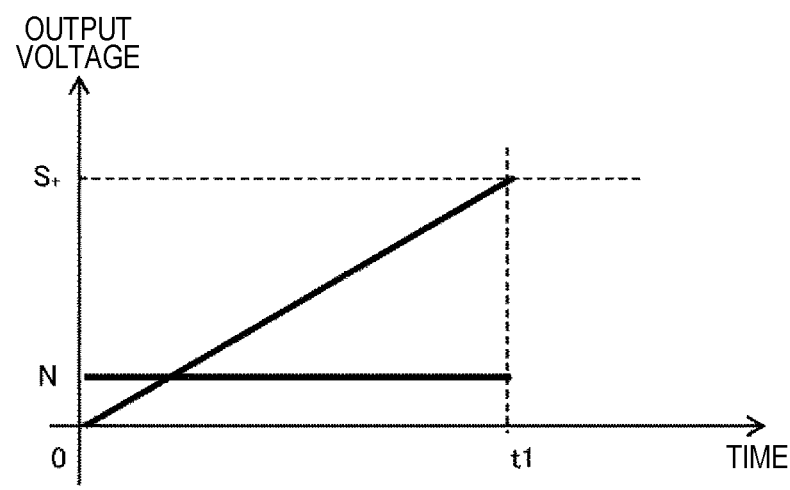
FIG. 3B is a schematic graph illustrating a state of an output signal of the simulated pressure sensor.

Next, referring to FIGS. 3A and 3B, the experiment and the result will be described. FIG. 3A is a schematic cross-sectional view illustrating a state of deformation of the simulated pressure sensor 20 implemented normally. FIG. 3B is a graph illustrating a relationship between output voltage of the semiconductor strain sensor 10 and time. In the experiment, a state of "time t=0" is an initial state in which no stress is applied to the metal plate. In this state, the signal component of the semiconductor strain sensor 10 is almost 0, and the noise component is N.

Subsequently, when bending stress is applied to the metal plate 21 of the simulated pressure sensor 20 until reaching "time t=t1," strain is generated in the metal plate 21. The strain in the metal plate 21 is transmitted via the solder joint layer 22 to the semiconductor strain sensor 10, voltage of the signal component of the semiconductor strain sensor 10 transiently changes from 0 to voltage $S_+$, and the noise component Vn is constant.

The finest measurement resolution of the semiconductor strain sensor is determined by how much the noise component N can be decreased relative to this signal component $S_+$.

The present inventors have considered the signal component expressed by Equation (3). The present inventors have thought that "a" representing the gauge factor is a value dependent on the semiconductor process, that increasing VDD is not favorable in consideration of low power consumption, which is an advantage, and that the way to increase the signal component is limited.

The present inventors have also considered the noise component expressed by Equation (4). The Boltzmann constant cannot be decreased since it is a constant. The present inventors have thought that the temperature and the bandwidth are dependent on an application using the sensor, that decreasing the resistance value R is not favorable in consideration of low power consumption, which is an advantage, and that the way to decrease the noise component is limited.

Figure 4:
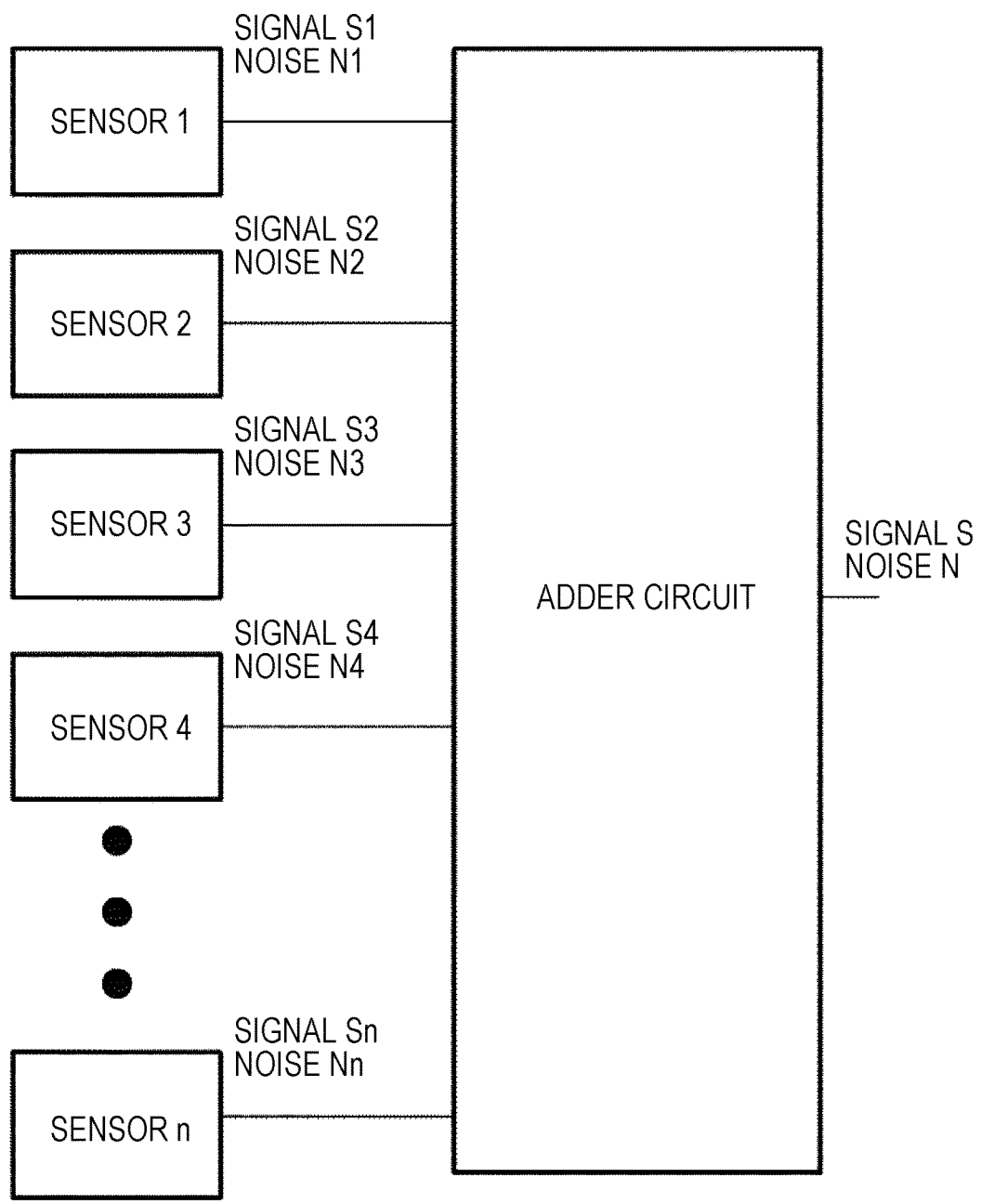
FIG. 4 is a schematic view in which a plurality of sensors and an adder circuit are connected.

Under such circumstances, the present inventors have examined a scheme of preparing a plurality of sensor bridges illustrated in FIG. 4 and adding the outputs to add the signal components. That is, as illustrated in FIG. 4, n sensor bridges 1 to n are prepared. In this case, signal components of the respective sensors are S1 to Sn, and noise components thereof are N1 to Nn. In this scheme, the signal component S of an adder circuit is a DC signal generated constantly with strain and is thus derived by simple addition as in Equation (5).

$$S = S1 + S2 + S3 \ldots + Sn \quad (5)$$

On the other hand, the noise components are generated at random from the respective resistors, and the summed signal is thus a mean square as shown in Equation (6).

$$N=(N1^2+N2^2+N3^2\ldots Nn^2)^{1/2} \quad (6)$$

In a case in which it is possible to provide n sensors which generate approximately equal strain in response to stress applied to the measured object and which can output approximately equal output voltage, Equation (7) is established with use of the signal component S1 and the noise component N1 of one bridge.

$$S/N=nS1/(n(N1)^2)^{1/2}=S1/N1\cdot n^{1/2} \quad (7)$$

Thus, the signal-to-noise ratio is improved in proportion to the one-half power of n by the n bridges.

Figure 5A:
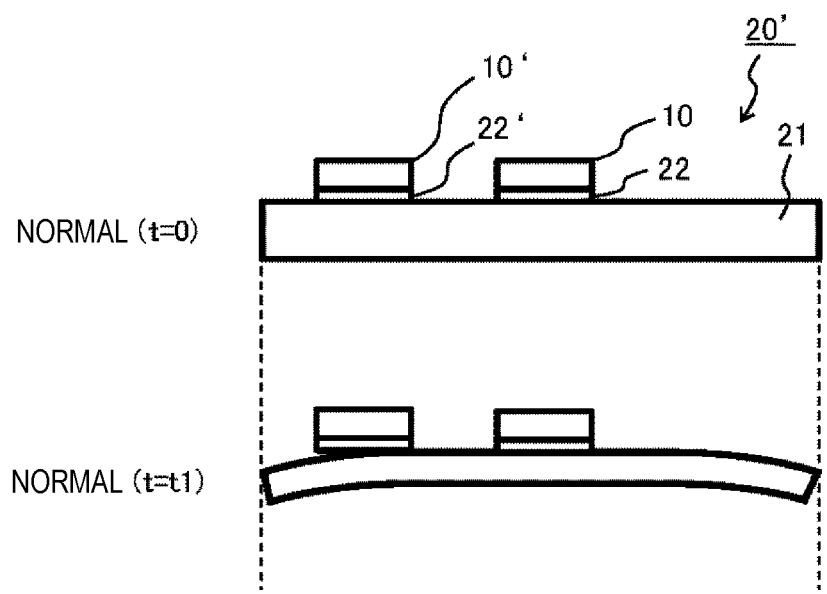
FIG. 5A is a schematic cross-sectional view in which a plurality of conventional strain sensors are arranged on a metal plate.
Figure 5B:
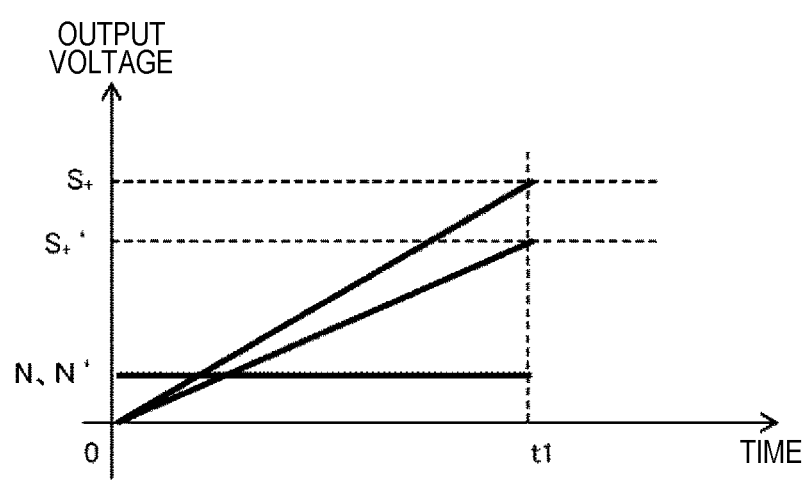
FIG. 5B is a schematic view illustrating a state of changes of output signals when the plurality of conventional strain sensors are arranged on the metal plate.

The above scheme of connecting the plurality of sensors in parallel to improve the signal-to-noise ratio is a conventional known technique. Problems of a case of using a conventional gauge with use of a metal thin film and a case of using the method described in PTL 3 (JP 2013-205403 A) will be described with reference to FIGS. 5A and 5B. In FIG. 5A illustrating an example of a conventional semiconductor strain sensor, as a simulated pressure sensor 20', the semiconductor strain sensor 10 and an equal semiconductor strain sensor 10' are arranged on the metal plate 21 side by side. Each of the outputs in a state of time t=0, at which no stress is generated to the metal plate, is approximately 0, and the noise components generated from the respective sensors are N and N'.

When a measured object is deformed by stress until reaching time t=t1, the output of the semiconductor strain sensor 10 is S+ while the output of the semiconductor strain sensor 10' is S+', in which case S+' is lower than S+. The reason for this is that, since the semiconductor strain sensors 10 and 10' are arranged to be spatially away from each other on the measured object to which the semiconductor strain sensors 10 and 10' are attached, the strain quantities generated in the sensors are not equal for structural reasons, and that equal output sensitivities cannot be obtained. For this reason, in this example, as an ideal effect as Equation (7) cannot be obtained even when the output components of the semiconductor strain sensors 10 and 10' are added. Also, in the conventional metal thin film gauge and semiconductor strain sensor, as the number of sensors increases, the sensors are spatially further away from each other for structural reasons, and the effect is harder to be obtained.

Under such circumstances, the present inventors have considered that, by provided the semiconductor strain sensor with a mechanism of adding outputs of n sensors having approximately equal sensitivities, with respect to the measured object, higher resolution is achieved.

According to the present invention, the aforementioned mechanical quantity measuring apparatus according to the present invention can be improved and modified in the following manner.

(i) A main surface of a semiconductor substrate is a {100} face of single-crystal silicon.

(ii) An x-axial direction and a y-axial direction of the semiconductor substrate correspond to a <110> direction of a silicon substrate. Each of a plurality of Wheatstone bridges arranged on the equal semiconductor substrate to detect a difference between strain quantities in the x-axial direction and the y-axial direction includes two P-type diffusion resistors providing current in the <110> direction, having a longitudinal direction in the y-axial direction, and arranged in a direction of causing current to flow parallel to the y axis and two P-type diffusion resistors providing current in the <110> direction, having a longitudinal direction in the x-axial direction, and arranged in a direction of causing current to flow parallel to the x axis.

(iii) The resistors constituting each of the plurality of Wheatstone bridges can detect strain generated in a measured object with approximately equal sensitivities as the resistors are equally arranged in an equal region.

(v) An operational circuit performing addition of strain quantities based on outputs from the plurality of Wheatstone bridges is further provided on the semiconductor substrate provided with the Wheatstone bridges.

Also, as described above, a pressure sensor according to the present invention is a pressure sensor in which a semiconductor strain sensor is connected to a metallic diaphragm, and the semiconductor strain sensor is constituted by the aforementioned mechanical quantity measuring apparatus according to the present invention.

According to the present invention, the aforementioned pressure sensor according to the present invention can be improved and modified in the following manner.

(vi) Connection of the semiconductor strain sensor to the metallic diaphragm is solder joint.

(vii) The pressure sensor is used as a pressure sensor for an automotive engine.

Hereinbelow, embodiments of the present invention will be described with reference to the drawings. It is to be noted that the present invention is not limited to the embodiments described herein and can arbitrarily be combined or improved without departing from the technical spirit of the invention. Similar members and parts are shown with the same reference signs, and description of the duplicate members and parts is omitted.

Embodiment 1

Figure 6A:
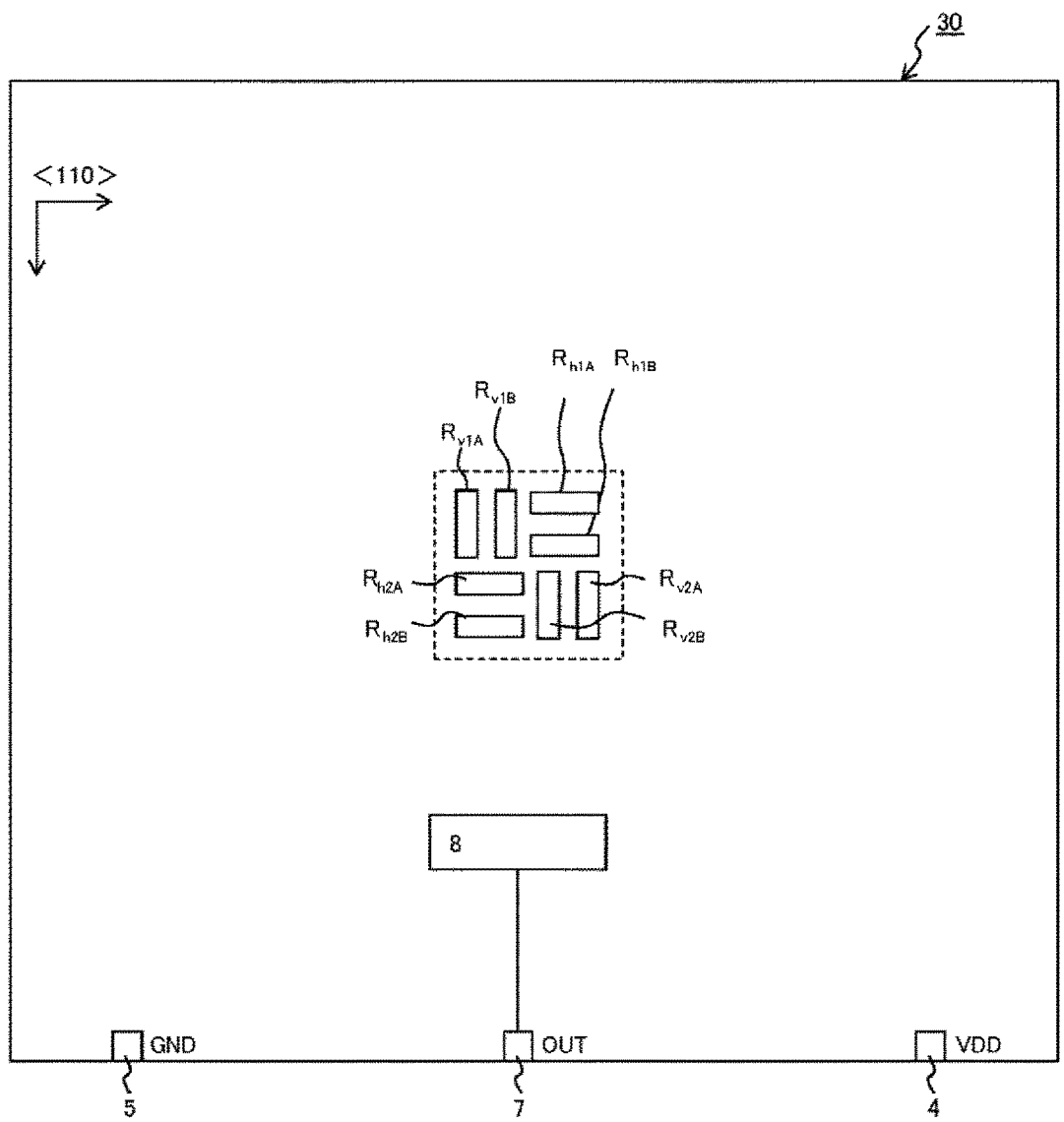
FIG. 6A is a schematic plan view illustrating an overview of a mechanical quantity measuring apparatus according to Embodiment 1.
Figure 6B:
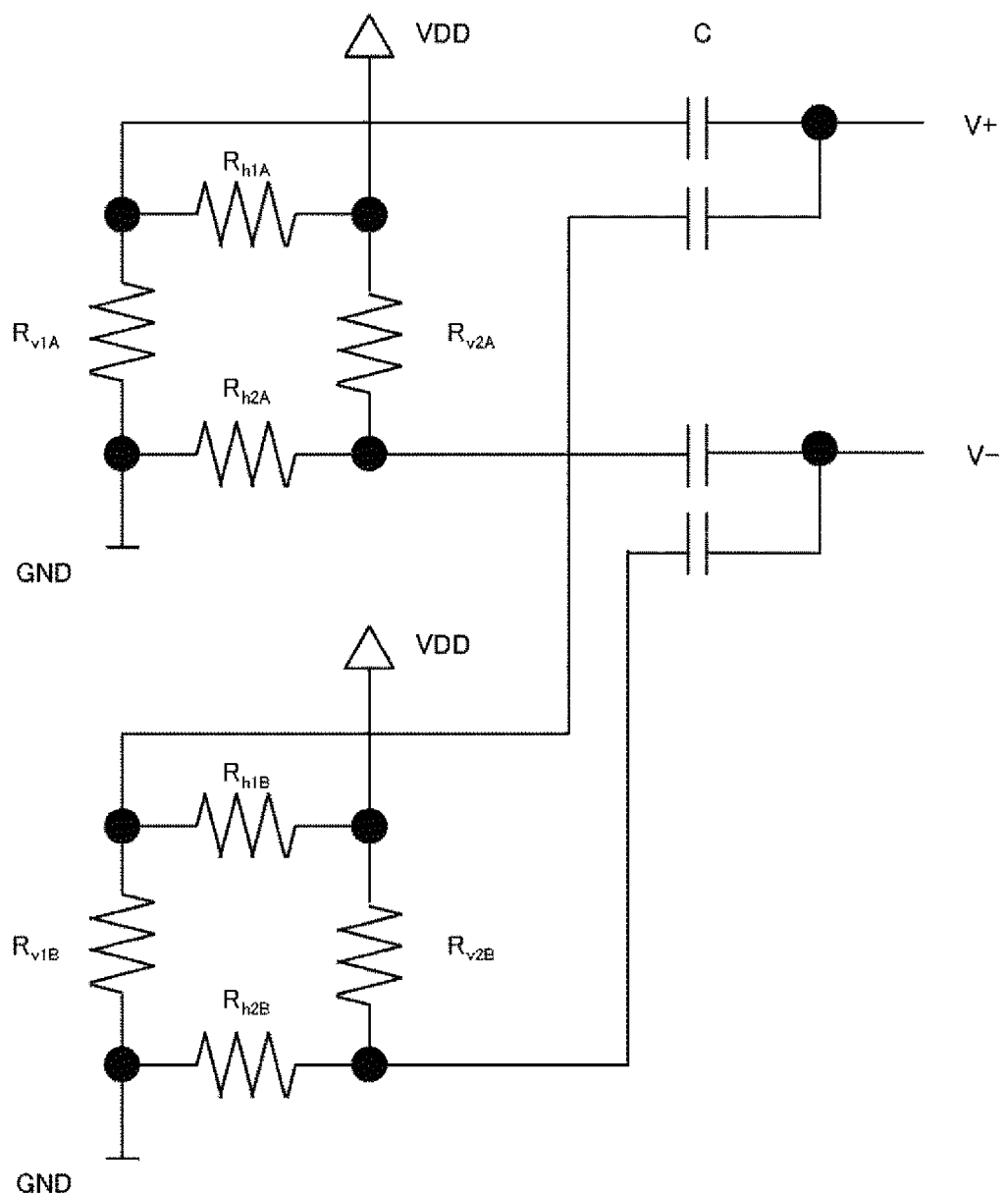
FIG. 6B illustrates a circuit configuration of the mechanical quantity measuring apparatus according to Embodiment 1.

Here, a technical spirit of a mechanical quantity measuring apparatus according to Embodiment 1 of the present invention will be described with reference to FIGS. 6A to 7B. FIG. 6A is a schematic plan view illustrating an overview of a mechanical quantity measuring apparatus according to Embodiment 1. In the present example, since the mechanical quantity measuring apparatus is schematically illustrated, interconnection patterns and the like other than resistors are omitted. Also, FIG. 6B illustrates an overview of a circuit configuration diagram of the mechanical quantity measuring apparatus.

As illustrated in FIG. 6A, a mechanical quantity measuring apparatus 30 (semiconductor strain sensor) according to Embodiment 1 includes two Wheatstone bridges constituted by approximately equal resistors on a surface of a semiconductor substrate (for example, the silicon single-crystal substrate 1). A Wheatstone bridge A consists of four resistors $R_{v1A}$, $R_{v2A}$, $R_{h1A}$, and $R_{h2A}$. Similarly, an adjacent Wheatstone bridge B consists of four resistors $R_{v1B}$, $R_{v2B}$, $R_{h1B}$, and $R_{h2B}$. Each of the Wheatstone bridges is desirably formed to be sufficiently smaller than the silicon single-crystal substrate 1. In the present embodiment, for example, the size of the silicon single-crystal substrate 1 is 4 mm square, and the size of each of the Wheatstone bridges A and B is formed to be 0.02 mm square.

To output a difference between strain generated in the X-axial direction and strain generated in the Y-axial direction, the Wheatstone bridges A and B collectively constitute the resistors $R_{h1A}$, $R_{h2A}$, and $R_{h2B}$, in which the resistance values change in accordance with the strain generated in the X-axial direction of the semiconductor substrate 1, and the resistors $R_{v1A}$, $R_{v1B}$, $R_{v2A}$, and $R_{v2B}$ in which the resistance values change in accordance with the strain generated in the Y-axial direction. These resistors $R_{h1A}$, $R_{h2A}$, $R_{h2B}$, $R_{v1A}$, $R_{v1B}$, $R_{v2A}$, and $R_{v2B}$ are P-type impurity diffusion resistors. More specifically, the resistors $R_{h1A}$, $R_{h1B}$, $R_{h2A}$, and $R_{h2B}$ are P-type diffusion resistors each of whose longitudinal direction is the Y-axial direction and each of which is arranged in a direction in which current flows parallel to the Y axis. Also, the resistors $R_{h1A}$, $R_{h1B}$, $R_{h2A}$, and $R_{h2B}$ are P-type diffusion resistors each of whose longitudinal direction is the X-axial direction and each of which is arranged in a direction in which current flows parallel to the X axis. The eight resistors are arranged around the center of the equal semiconductor substrate 1, have equal dimensions to each other, and are arranged to be close to each other. As for specific dimensions, for example, each of the resistors is a P-type diffusion resistor with a width of 5 μm, a length of 15 μm, and a resistance value of 0.3 kΩ, and the resistors are arranged at intervals of 5 μm. In this case, the resistors of the Wheatstone bridges A and B are arranged approximately equally in a region of approximately 20 μm square around the center of the semiconductor substrate 1 provided with the resistors and can have approximately equal output sensitivities to an average strain quantity generated in the 20-μm-square region.

The output voltage values of the Wheatstone bridges A and B are added in an adder circuit 8. In FIG. 6B, voltage coupling in capacitors C is illustrated. Thus, a signal component (in FIG. 6B, a voltage difference between differential voltage V+ and differential voltage V−) can be doubled by simple addition, a noise component can be square-averaged, and a signal-to-noise component can be improved $2^{1/2}$ times.

Figure 7A:
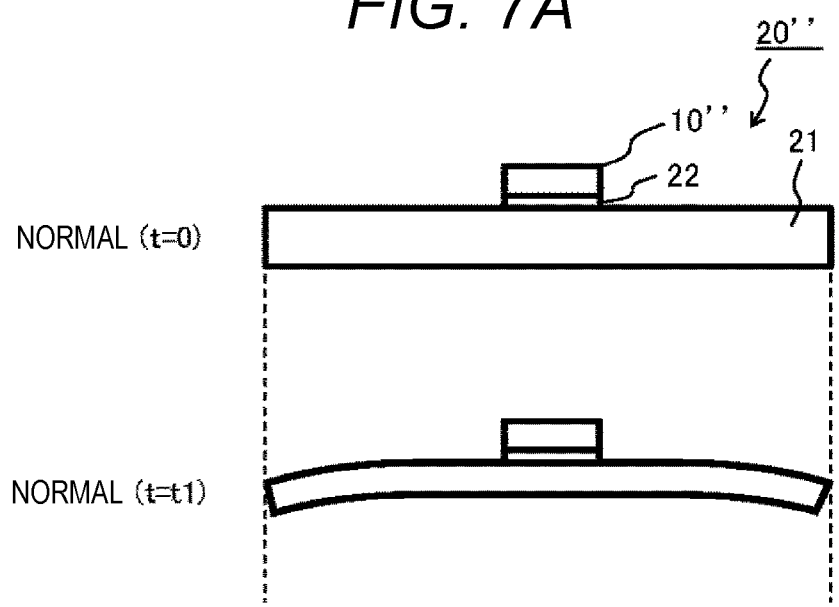
FIG. 7A is a schematic cross-sectional view illustrating a state of deformation when the mechanical quantity measuring apparatus according to Embodiment 1 is arranged on the metal plate.
Figure 7B:
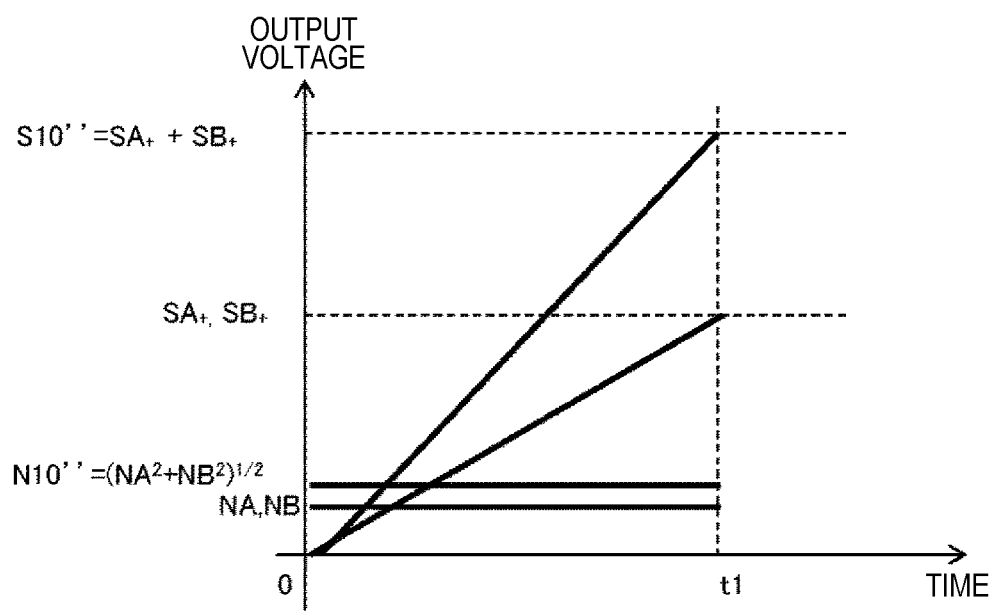
FIG. 7B is a schematic view illustrating a state of changes of output signals when the mechanical quantity measuring apparatus according to Embodiment 1 is arranged on the metal plate.

FIG. 7A is a schematic view illustrating a semiconductor strain sensor 10", having mounted thereon the Wheatstone bridges A and B and the adder circuit 8, implemented on a measured object 21. At this time, the dimensions of the resistors are equal to those in the example illustrated in FIG. 3. In a similar manner to that in FIG. 3, when stress is applied to the object until reaching time t1, output signal components $SA_+$ and $SB_+$ of the Wheatstone bridges A and B increase with approximately equal sensitivities as illustrated in FIG. 7B. Thus, an output component of the semiconductor strain sensor 10" after addition in the adder circuit 8 is a signal component which is approximately twice as high as that of the semiconductor strain sensor illustrated in FIG. 3A as shown in Equation (8).

$$S10''=SA_++SB_+=2S_+ \quad (8)$$

On the other hand, since noise components are generated at random from the respective resistors, the noise components are square-averaged, and a summed signal is approximately 1.4 times of that of the semiconductor strain sensor illustrated in FIG. 3A as shown in Equation (9).

$$N10''=((NA)^2+(NB)^2)^{1/2}=1.4N \quad (9)$$

Accordingly, a signal-to-noise component of the semiconductor strain sensor 10" is improved approximately 1.4 times of that of the semiconductor strain sensor 10 illustrated in FIG. 3A.

Embodiment 2

Here, another example of Embodiment 1 described above will be described with reference to FIGS. 8A and 8B.

Figure 8A:
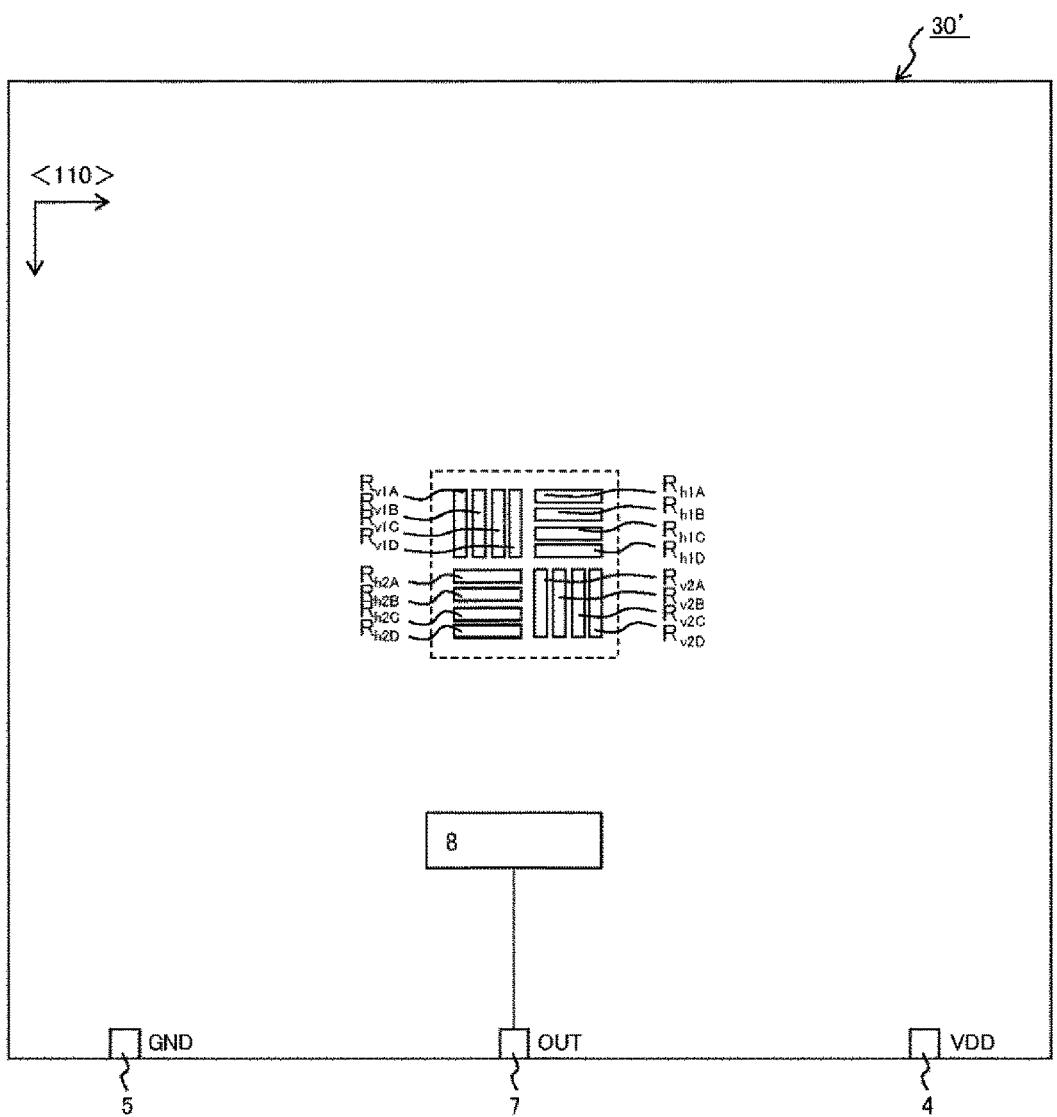
FIG. 8A is a schematic plan view illustrating an overview of a mechanical quantity measuring apparatus according to Embodiment 2.
Figure 8B:
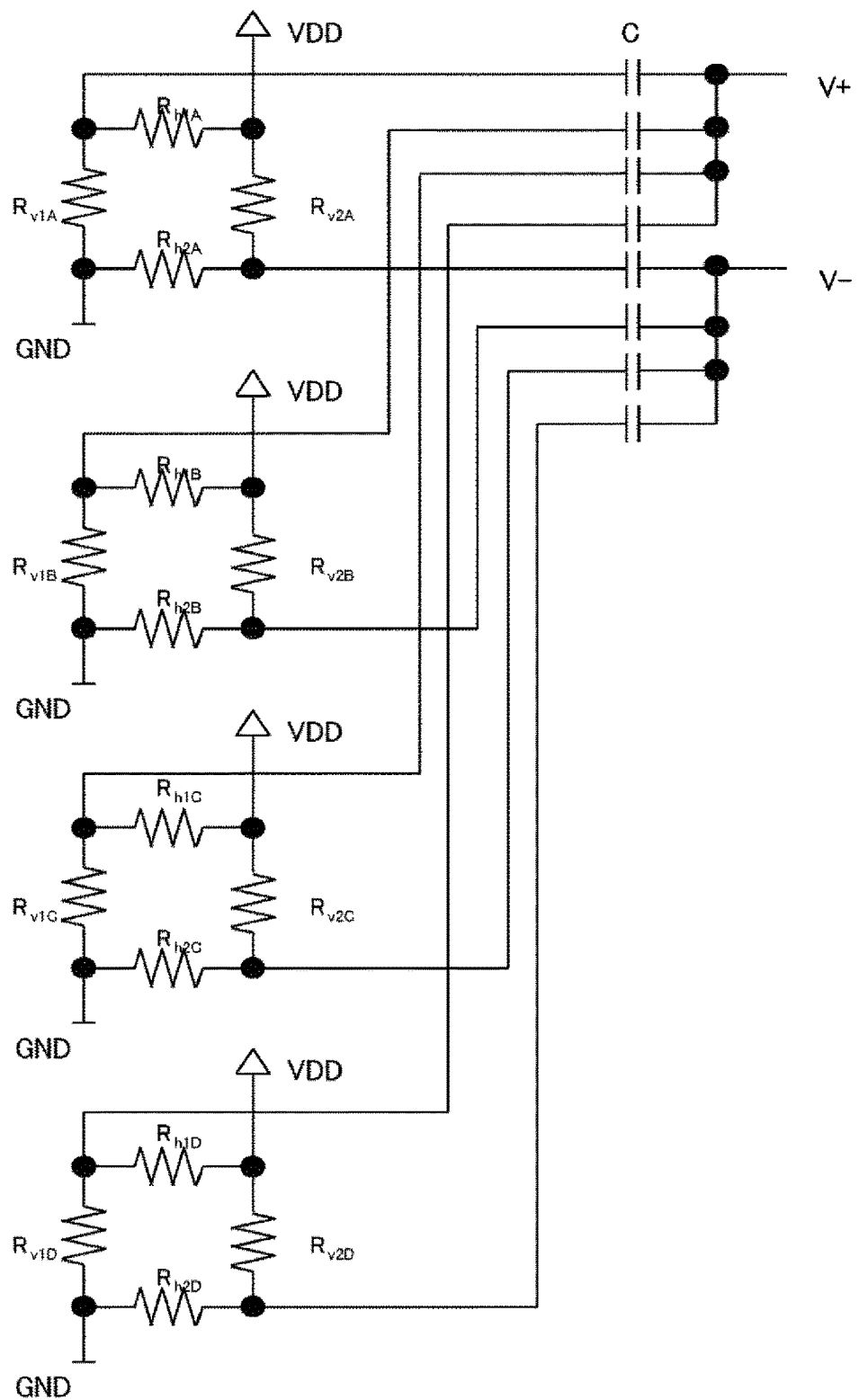
FIG. 8B illustrates a circuit configuration of the mechanical quantity measuring apparatus according to Embodiment 2.

FIG. 8A is a schematic view of a mechanical quantity measuring apparatus including four Wheatstone bridges A, B, C, and D. In this example, similarly to the Wheatstone bridges A and B illustrated in Embodiment 1, respective resistors of the Wheatstone bridges A, B, C, and D are arranged around a center of a chip and arrange to be close to each other. It is to be noted that, in the schematic plan view in FIG. 8A, details of interconnections (for example, interconnections among the impurity diffusion resistors) are omitted for simplification of the drawing.

As illustrated in FIG. 8A, resistors $R_{v1A}$, $R_{v1B}$, $R_{v1C}$, $R_{v1D}$, $R_{v2A}$, $R_{v2B}$, $R_{v2C}$, $R_{v2D}$, $R_{h1A}$, $R_{h1B}$, $R_{h1C}$, $R_{h1D}$, $R_{h2A}$, $R_{h2B}$, $R_{h2C}$, and $R_{h2D}$ constituting the Wheatstone bridges A, B, C, and D in the present embodiment are P-type diffusion resistors having equal widths and lengths and are arranged to be adjacent to each other at the center of the chip. As for specific dimensions, each of the resistors is a resistor with a width of 2.5 μm, a length of 15 μm, and a resistance value of 0.6 kΩ, and the resistors are arranged at intervals of 2.5 μm.

Thus, in a region provided with the impurity diffusion resistors constituting the Wheatstone bridges, the resistors constituting the Wheatstone bridges A, B, C, and D are arranged equally and can have approximately equal output sensitivities to an average strain quantity generated in the region of approximately 20 μm square. In a case in which the same experiment as FIG. 7A is performed with use of the semiconductor substrate illustrated in FIGS. 8A and 8B, a signal component is quadrupled, a square-averaged noise component is doubled, and a signal-to-noise ratio is improved twice of that in the example illustrated in FIG. 3.

Embodiment 3

Here, another example of Embodiments 1 and 2 described above will be described with reference to FIGS. 9A and 9B.

Figure 9A:
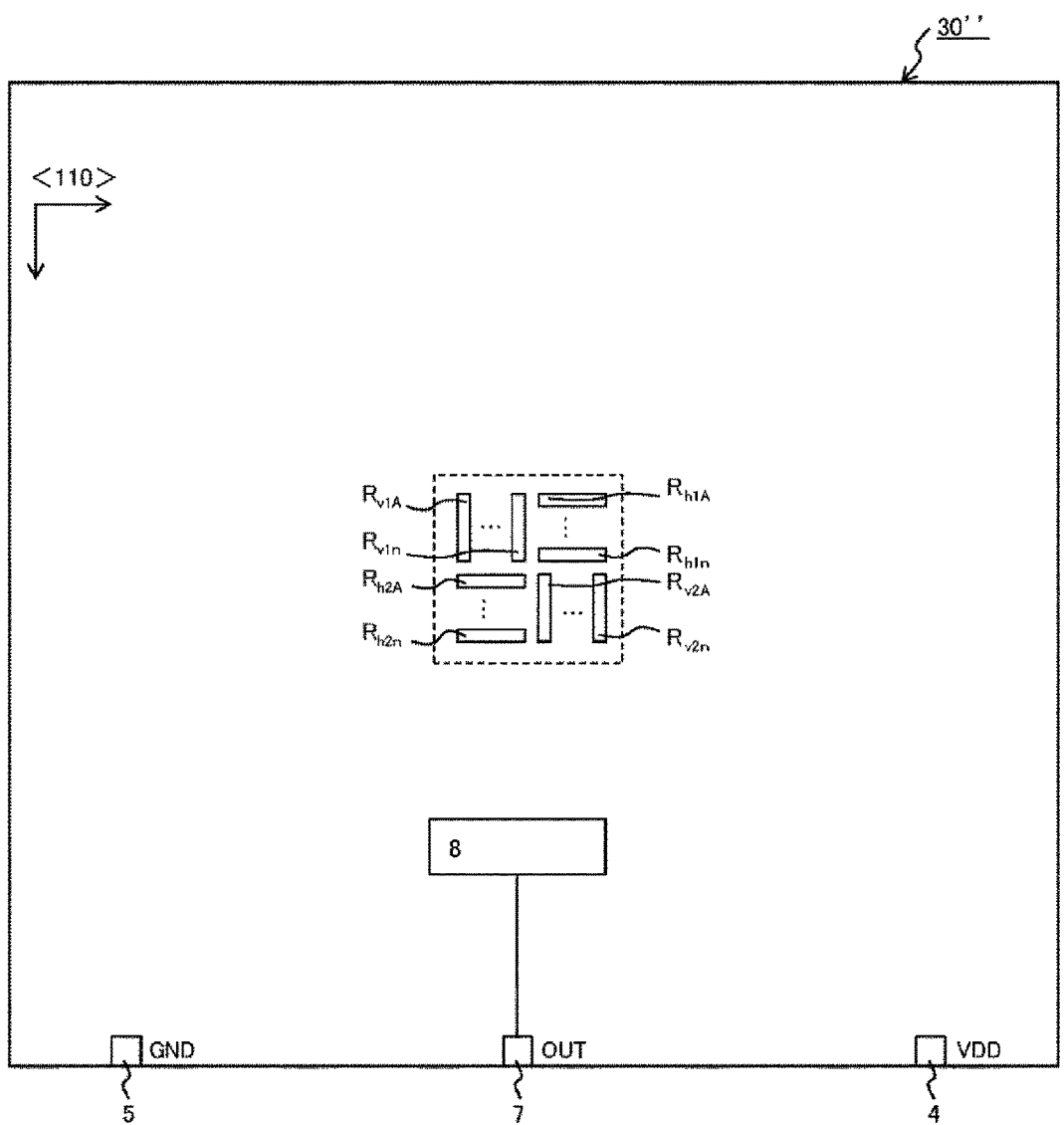
FIG. 9A is a schematic plan view illustrating an overview of a mechanical quantity measuring apparatus according to Embodiment 3.
Figure 9B:
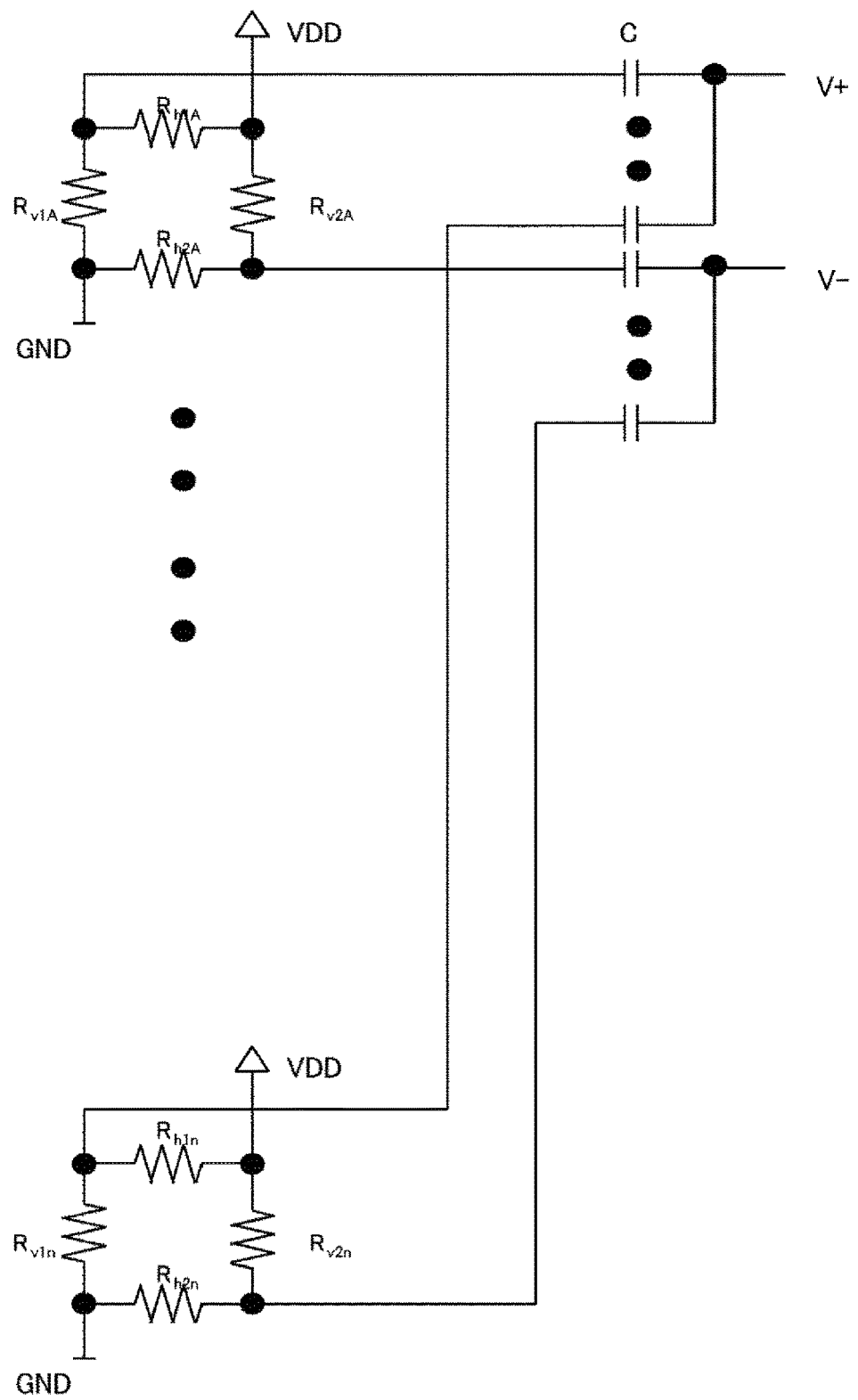
FIG. 9B illustrates a circuit configuration of the mechanical quantity measuring apparatus according to Embodiment 3.

FIG. 9A is a schematic plan view of a semiconductor strain sensor including n finite Wheatstone bridges. In the present example, since the semiconductor strain sensor is schematically illustrated, interconnection patterns and the like other than resistors are omitted. Also, FIG. 9B illustrates an overview of a circuit configuration diagram of the semiconductor strain sensor.

All resistors consisting of Wheatstone bridge A to Wheatstone bridge n are constituted by resistors having equal widths and lengths and are arranged to be adjacent to each other. Thus, in a region provided with the impurity diffusion resistors constituting the Wheatstone bridges, the resistors constituting the Wheatstone bridges are arranged equally and can have approximately equal output sensitivities to an average strain quantity generated in the provided region. Accordingly, in a case in which the same experiment as that in FIG. 3 is performed with use of the semiconductor strain sensor including the n Wheatstone bridges, the signal component and the noise component can be expressed by Equations (5), (6), and (7).

Embodiment 4

Figure 10:
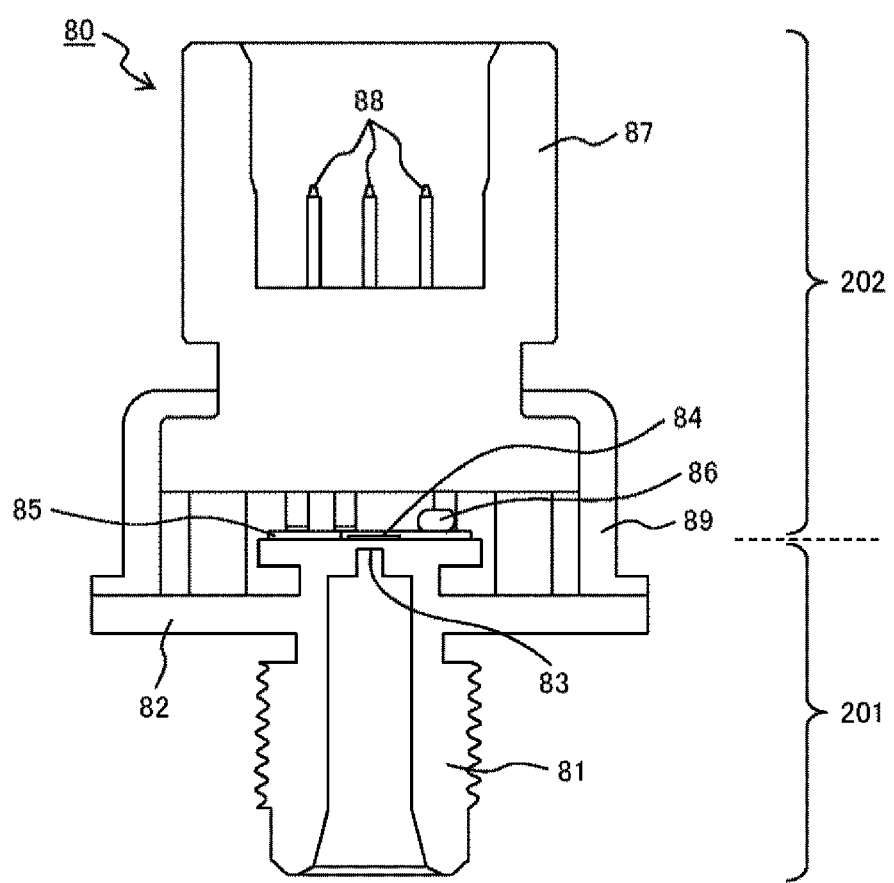
FIG. 10 is a schematic cross-sectional view illustrating an example of a pressure sensor according to the present invention.

Here, a pressure sensor according to the present invention will be described with reference to FIG. 10. The pressure sensor according to the present invention is characterized by using the mechanical quantity measuring apparatus according to Embodiment 1, 2, or 3 as a strain sensor. FIG. 10 is a schematic cross-sectional view illustrating an example of the pressure sensor according to the present invention.

As illustrated in FIG. 10, a pressure sensor 80 according to the present embodiment is broadly divided into a sensor unit 201 receiving pressure and converting the pressure into an electric signal and a connector unit 202 transmitting the electric signal to an external device. The sensor unit 201 includes a metallic pressure leading unit 81 formed in a bottomed cylindrical shape opened at one end and closed at the other end and inserted in a pressure port, a flange 82 defining the insertion amount of the pressure leading unit 81, a diaphragm 83 receiving pressure on the closed end side of the pressure leading unit 81 and deformed, a strain sensor 84 solder-connected onto the diaphragm 83, and a control mechanism (control unit) 85 connected to the strain sensor 84 to control the strain sensor 84. The control mechanism 85 is provided with a memory having stored therein various data for use in calculation for correction, a capacitor 86, and the like. The connector unit 202 includes a connector 87 connected to the external device, a connection terminal 88 transmitting the electric signal, and a cover 89 securing the connector 87 to the sensor unit.

The foregoing embodiments are described to facilitate understanding of the present invention, and the present invention is not limited to the specific configurations described herein. For example, some components of one embodiment can be substituted with components of another embodiment, and components of another embodiment can be added to components of one embodiment. Further, some components of each embodiment can be added, deleted, and substituted with other components. It is to be noted that, in the present invention, the expression, "output signal components of a plurality of Wheatstone bridges increase with approximately equal sensitivities," includes not only a case in which output signal components increase with equal sensitivities but also a case in which output signal components increase, having a sensitivity difference falling within a predetermined range.

REFERENCE SIGNS LIST 1 silicon single-crystal substrate
2 impurity diffusion resistor
3 Wheatstone bridge
4 power supply terminal
5 ground terminal
6 amplifier circuit
7 output terminal
8 adder circuit
10 semiconductor strain sensor
20, 20', 20" simulated pressure sensor
21 metal plate
22 solder joint layer
23 terminal block
30, 30', 30" mechanical quantity measuring apparatus
80 pressure sensor
81 pressure leading unit
82 flange
83 diaphragm
84 strain sensor
85 control mechanism
86 capacitor
87 connector
88 connection terminal
89 cover A first Wheatstone bridge
B second Wheatstone bridge
201 sensor unit of pressure sensor
202 terminal unit of pressure sensor

The invention claimed is:

1. A mechanical quantity measuring apparatus including:
a plurality of Wheatstone bridges formed on a main surface of a semiconductor substrate by a plurality of impurity diffusion resistors, and
an adder circuit that receives and adds output differential voltage values of the plurality of Wheatstone bridges, wherein
the plurality of impurity diffusion resistors are arranged to be close to each other so that output signal components which are the output differential voltage values of the plurality of Wheatstone bridges increase with approximately equal sensitivities in accordance with an average strain quantity in a region to be measured, and
a difference between a strain quantity generated in an x-axial direction and a strain quantity generated in a y-axial direction is detected from the additional result of the adder circuit, the x-axial direction and the y-axial direction being perpendicular to each other on the main surface of the semiconductor substrate.

2. The mechanical quantity measuring apparatus according to claim 1, wherein the main surface of the semiconductor substrate is a face of single-crystal silicon.

3. The mechanical quantity measuring apparatus according to claim 2, wherein the x-axial direction and the y-axial direction correspond to a direction of a silicon substrate, and
wherein each of the plurality of Wheatstone bridges includes four resistors which is the plurality of impurity diffusion resistors providing current in the direction, and the four resistors comprise a first y-axial-direction resistor and a second y-axial-direction resistor each being formed by a P-type diffusion resistor having a longitudinal direction in the y-axial direction, and arranged in a direction of causing current to flow parallel to the y axis, and a first x-axial-direction resistor and a second x-axial-direction resistor each being formed by a P-type diffusion resistor having a longitudinal direction in the x-axial direction, and arranged in a direction of causing current to flow parallel to the x axis.

4. The mechanical quantity measuring apparatus according to claim 3, wherein the respective resistors forming the plurality of Wheatstone bridges are arranged to be adjacent to each other with a shorter interval than a length thereof in the longitudinal direction.

5. The mechanical quantity measuring apparatus according to claim 3, wherein the adder circuit and an output terminal of the adder circuit are arranged on the main surface of the semiconductor substrate.

6. A pressure sensor having a semiconductor strain sensor connected onto a metallic diaphragm, wherein the semiconductor strain sensor is the mechanical quantity measuring apparatus according to claim 1.

7. The pressure sensor according to claim 6, wherein the semiconductor strain sensor is connected onto the metallic diaphragm by means of solder joint.

8. The pressure sensor according to claim 6, wherein the pressure sensor is a pressure sensor for an automotive engine.

* * * * *